Figure 1:
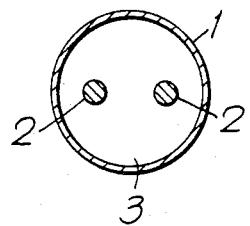

United States Patent [19]

Gill

[11] Patent Number: 4,512,827
[45] Date of Patent: Apr. 23, 1985

[54] METHOD OF MANUFACTURING MINERAL INSULATED ELECTRIC CABLE AND LIKE ELEMENTS

[75] Inventor: Dennis Gill, Lancashire, England

[73] Assignee: Associated Electrical Industries Limited, England

[21] Appl. No.: 410,051

[22] Filed: Aug. 20, 1982

[30] Foreign Application Priority Data

Sep. 21, 1981 [GB] United Kingdom ............... 8128424

[51] Int. Cl.³ .................... H01B 13/10; H01C 1/03
[52] U.S. Cl. ........................................ 156/48; 29/614;
156/54; 174/102 P; 174/118; 219/544; 338/238
[58] Field of Search ............. 29/614, 615; 106/73.5;
156/48, 50, 54; 174/102 P, 118; 219/544;
228/130; 252/62; 338/238; 428/405

[56] References Cited

U.S. PATENT DOCUMENTS 2,866,760 12/1958 Haessler et al. ............... 423/275 X
4,101,760 7/1978 Roller ................................ 219/544
4,129,774 12/1978 Inano .............................. 252/62 X
4,269,639 5/1981 Lewis .................................. 156/54

FOREIGN PATENT DOCUMENTS 416725 9/1934 United Kingdom .
1137451 12/1968 United Kingdom .
2056158 3/1981 United Kingdom .

Primary Examiner—Robert A. Dawson
Attorney, Agent, or Firm—Kirschstein, Kirschstein, Ottinger & Israel

[57] ABSTRACT

In a mineral insulated electric cable the powdered insulating material is impregnated with a quantity of a hydrophobic material, for example a silicone, which has been introduced into the powder in liquid form. The added hydrophobic material serves as a barrier against the ingress of moisture, and liquid dimethylpolysiloxane has been found particularly effective, the pressure of even a small quantity of this preventing any significant degree of moisture penetration into the cable.

5 Claims, 4 Drawing Figures

U.S. Patent  Apr. 23, 1985  4,512,827

METHOD OF MANUFACTURING MINERAL INSULATED ELECTRIC CABLE AND LIKE ELEMENTS

This invention relates to mineral insulated electric cables and like elements, that is to say elements of the type comprising one or more electrical conductor wires enclosed within a tubular metal sheath, and insulated from the sheath by a filling of compacted powdered insulating material.

Such elements will hereinafter be referred to simply as "mineral insulated electric cables" but this term is to be understood to include, in addition to wiring cables for the conduction of electric current for general purposes, elements of the construction described above which are designed to be employed for other purposes, for example sensing cables, heating cables, including sheathed wire electric heating elements, and thermocouple cables. The invention also includes within its scope the manufacture of such elements.

The powdered insulating material which is most commonly used is magnesium oxide either fused or calcined or as sea-washed magnesia, and although magnesium oxide has a high electrical breakdown strength when dry the presence of even a small amount of moisture can reduce this significantly.

Consequently the ingress of moisture is a major problem, particularly in the case of cables designed to operate athigh voltages. In the case of wiring cables it is therefore recommended that the ends of lengths of cable in store be provided with temporary seals to reduce moisture penetration. Nevertheless prior to forming a termination in a length of stored cable required for use it is invariably necessary to cut off an appreciable length, in some cases as much as 300 mm, from the ends of the cable in order to ensure that any damp powder, which would effect the insulating properties of the cable, is removed. This is clearly wasteful. Moreover terminations, formed in both this and other forms of cable, need to provide effective seals to prevent any subsequent moisture penetration in use.

According, therefore, to the present invention in a mineral insulated electric cable the filling of powdered insulating material is impregnated with a quantity of a hydrophobic material which has been introduced into the powder in liquid form. The liquid hydrophobic material is readily absorbed by the powder and even a small amount of the liquid has been found sufficient to reduce moisture penetration to a marked extent.

The hydrophobic material is preferably a liquid silicone and is preferably present in a proportion of 0.03% to 0.6% by weight with respect to the insulating material, for example approximately 0.11%.

The liquid hydrophobic material should, of course, also have electrically insulating properties such that it does not have a deleterious effect on insulating properties of the powder filling.

It is believed that the hydrophobic material forms a coating around the particles of powder and thereby provides a barrier to subsequent moisture penetration, and we have found liquid dimethylpolysiloxane, for example that sold by Dow Corning Limited as Silicone Fluid No. 17, to be a particularly efficient hydrophobic material suitable for this purpose. Thus a cable having a filling with between 1 and 20 mls of such a liquid added to each 5.0 kilograms of powdered magnesium oxide shows no significant moisture penetration even after many weeks storage, without the need for any separate end seals.

Accordingly a cable in accordance with the invention can be stored without temporary end seals, and when required to be used the end does not require to be cut back further than is necessary to physically form the required termination, as there is no damp powder which needs to be removed.

Moreover not only does the incorporation of liquid dimethylpolysiloxane within the filling have no detrimental effect on the electrical insulating properties of the filling, it has, in fact, been found to improve the electrical breakdown strength of the filling, particularly at high voltages, due, it is believed, to the exclusion of free moisture throughout the length of the cable.

The sheath may be continuously formed from a ductile metal strip by bending the strip into tubular form and welding the edges together, whilst simultaneously introducing dry filling material and the conductor wire or wires into the sheath tube so formed, the liquid hydrophobic material being also introduced at this stage separately from the powder insulation.

In such a case the or each said conductor wire may be guided into the sheath through a respective guide tube and the liquid hydrophobic material can also be introduced into the sheath through the guide tube or tubes, although a separate delivery tube could alternatively serve for such a purpose.

Conveniently the powder insulation is introduced into the sheath tube through a delivery tube having its outlet downstream of the weld to avoid contamination of the weld, the liquid hydrophobic material also being delivered into the sheath tube, either through the conductor wire guide tubes or a separate delivery tube, downstream of the weld.

Following the introduction of the conductor or conductors and the filling powder and liquid, the diameter of the sheath tube will usually be reduced by passing it through a series of reduction rollers or dies and annealing furnaces in known manner.

The use of a liquid hydrophobic material has the further advantage that, during subsequent reducing and annealing processes, it acts as a lubricant, and this results in a pronounced reduction in the degree of abrasion of the conductor wire or wire sand of the inner surface of the sheath.

Consequently the pronounced adherence of the filling powder to the conductor wire or wires, as is commonly experienced with mineral insulated electric cables as manufactured hitherto, is virtually avoided, and any loose powder on the surfaces of the wire or wires or on the inner surface of the sheath tube can be removed without difficulty when forming a termination.

However other liquid aryl or alkylpolysiloxanes or mixtures thereof or any other suitable liquid hydrophobic, electrically insulating material might alternatively be used as an additive to the filling powder in a mineral insulated electric cable in accordance with the invention.

Figure 2:
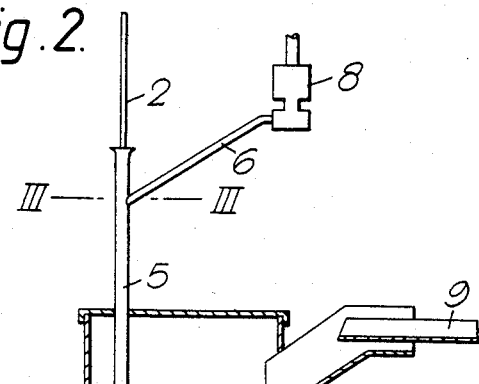
Figure 3:
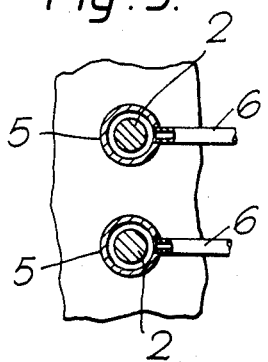
Figure 4:
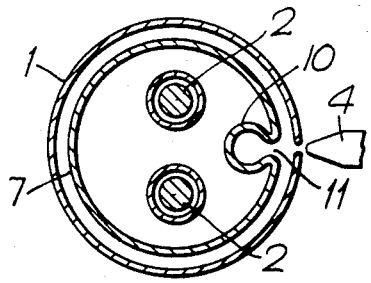

One mineral insulated electric cable and the manufacture thereof will now be decribed by way of example with reference to FIGS. 1 to 4 of the accompanying schematic drawing, in which FIG. 1 represents a transverse section through the cable, FIG. 2 illustrates diagrammatically an elevation of part of one form of apparatus for manufacturing the cable, and FIGS. 3 and 4 represent plan sections on an enlarged scale through different regions of the apparatus illustrated in FIG. 2.

Referring first to FIG. 1, the cable comprises an outer sheath 1 formed from a copper strip bent into tubular form and argon arc welded along the abutting edges. The sheath tube 1 contains a plurality of conductor wires 2 (in this case two) separated from each other and from the sheath tube 1 by a filling of powdered fused magnesium oxide 3, the powder being compacted around the conductors, following the introduction of the powder and conductors into the formed sheath tube, by a series of reduction stages, each followed by an annealing and quenching stage in known manner.

In accordance with the invention the sheath 1 contains, in addition to the powdered magnesium oxide a quantity of a dimethylpolysiloxane which has been introduced into the sheath in liquid form so that it penetrates into the magnesium oxide powder 3 surrounding the conductor wires 2.

The liquid dimethylpolysiloxane is introduced into the sheath tube 1 in the ratio of 3.5 mls of liquid to 5.0 kilogram of the powdered magnesium oxide and it has been found that even this small proportion of liquid imparts a marked hydrophobic quality to the filling which resists the penetration of moisture, and prevents any significant deterioration of the insulating properties of the filling adjacent severed ends of the cable for long periods without the need to provide additional seals, either during storage or when forming subsequent terminations.

Consequently when forming a termination it is not necessary to cut back the end of the cable further than is necessary to physically form the termination.

The cable may be manufactured by a continuous process, and one such process is illustrated in FIGS. 2 to 4 of the drawings.

In such a process the cable sheath 1 is formed in a continuous manner from a thoroughly degreased copper strip 1a by means of a tube forming machine (not shown) which bends the downwardly fed strip into tubular form, and an argon arc welding head 4 which welds the abutting edges of the strip. The formed sheath tube 1, with the conductor wires 2 and the magnesium oxide powder 3 introduced into it, is fed vertically downwards to a reduction machine, which reduces the diameter of the tube and compacts the filling powder around the conductor wires. The reduced tube is then fed through an annealing furnace, and then through a water quenching tank in which the cable is turned in a catenary curve to continue travelling horizontally through further reduction machines, annealing furnaces and quenching tanks. The reduction machines and associated equipment have, however, been omitted from the drawing for simplicity.

The conductor wires 2, which are also thoroughly degreased before their introduction into the sheath tube 1, are fed continuously downwards into the tube, as it is being formed, through a pair of vertical guide tubes 5 rigidly located in desired positions within a powder delivery tube 7 through which the magnesium oxide powder is fed. The powder is introduced into the delivery tube 7 from a hopper 8 which is kept replenished from a vibratory conveyor 9 supplied, in turn, from a powder reservoir.

The lower ends of the powder delivery tube 7 and of the guide tubes 5 terminate below the weld so that the magnesium oxide powder 3 is effectively fed into the already formed and welded tube, and is thereby prevented from contaminating the weld.

The guide tubes 5 are preferably disposed, as shown in FIG. 4, on opposite sides of the plane containing the axis of the sheath tube 1 and the welding head 4, and a further tube 10, by which argon is introduced into the sheath tube to maintain an inert atmosphere in the weld area, extends downwards within the powder delivery tube 7 adjacent the seam edges of the sheath tube 1, the lower end communicating with the weld area through an opening 11 in the wall of the delivery tube. The opening 11 is sealed around its edges to the argon delivery tube 10 to prevent escape of the magnesium oxide powder in the vicinity of the weld.

In accordance with the invention liquid dimethylpolysiloxane, for example Dow Corning Silicone Fluid No. 17, is introduced into the filling powder by being fed at a controlled rate through small bore pipes 6 into the conductor guide tubes 5 from a reservoir (not shown) by means of an adjustable low output pump 8. In a particular example in which the diameter of the sheath tube 1, before reduction, is of the order of 20 mm, and has an initial rate of travel past the welding head 4 of about 2 meters a minute, with the magnesium oxide powder being fed into the delivery tube 7 at a rate of about 1.0 kilogram a minute, the dimethylpolysiloxane was introduced into the conductor wire guide tubes 5 at approximately 0.7 ml a minute, although this ratio is not critical.

Although a vertical cable forming process has been described, the invention is also applicable to mineral insulated cables formed by a so-called horizontal process, in which the strip, which is to form the sheath tube, and the conductor wires are fed horizontally past the welding position. In such ra case the liquid dimethylpolysiloxane is conveniently introduced into the powder filling through a separate delivery tube.

I claim:

1. The method of manufacturing mineral insulated electric conductive cable comprisng steps of
    A. continuously at a first position bending a ductile metal strip into tubular form,
    B. continuously at a second position downstream of the first position welding the edges of the strip together to form a sheath,
    C. continuously at positions downstream of the second position introducing into the sheath being continuously formed
        (i) electrical conductive wire
        (ii) a filling of powdered insulating material and
        (iii) a liquid hydrophobic material in the form of liquid silicone,
    D. the liquid silicone being introduced into the sheath separately from the powdered insulating material, and
    E. subsequently continuously reducing the diameter of the continuously formed sheath.

2. The method of manufacturing mineral insulated electric conductive cable comprising steps of
    A. continuously at a first position bending a ductile metal strip into tubular form,
    B. continuously at a second position downstream of the first position welding the edges of the strip together to form a sheath,
    C. continuously at positions downstream of the second position introducing into the sheath being continuously formed
        (i) electrical connductive wire (ii) a filling of powdered insulating material and (iii) a liquid hydrophobic material in the form of liquid silicone, D. the liquid silicone and the powdered insulating material being introduced into the sheath through separate delivery tubes having their outlets downstream of the welding position, E. subsequently continuously reducing the diameter of the continuously formed sheath.

3. The method of manufacture according to claim 2 wherein the liquid silicone and the conductive wire are introduced into the sheath concurrently and separately from the introduction into the sheath of the powdered insulating material.

4. The method of manufacturing according to claim 2 wherein the liquid silicone consists of liquid dimethylpolysiloxane in a ratio of between 1.0 and 20.0 mls to each 5.0 kilograms of magnesium oxide as the powdered insulating material.

5. The method of manufacture according to claim 4 wherein the ratio of liquid dimethylpolysiloxane to powdered magnesium oxide is approximately 3.5 mls to 5.0 kilograms.

* * * * *